(12) United States Patent
Kim

(10) Patent No.: US 7,419,856 B2
(45) Date of Patent: Sep. 2, 2008

(54) METHODS OF FABRICATING INTEGRATED CIRCUIT DEVICES HAVING FUSE STRUCTURES INCLUDING BUFFER LAYERS

(75) Inventor: Hyun-Chul Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/699,782

(22) Filed: Jan. 30, 2007

(65) Prior Publication Data

US 2007/0122945 A1    May 31, 2007

Related U.S. Application Data

(62) Division of application No. 10/663,967, filed on Sep. 16, 2003, now Pat. No. 7,186,593.

(30) Foreign Application Priority Data

Nov. 7, 2002 (KR) .............................. 2002-68933

(51) Int. Cl.
*H01L 21/82* (2006.01)
(52) U.S. Cl. ...................................... 438/132; 438/128
(58) Field of Classification Search ................ 438/132, 438/529; 257/529, 328
See application file for complete search history.

(56) References Cited

U.S. PATENT DOCUMENTS

| | | | |
|---|---|---|---|
| 5,025,300 A | 6/1991 | Billig et al. | |
| 6,040,614 A | 3/2000 | Kitaguchi et al. | |
| 6,100,117 A | 8/2000 | Hao et al. | |
| 6,100,118 A | 8/2000 | Shih et al. | |
| 6,121,073 A | 9/2000 | Huang et al. | |
| 6,180,503 B1 | 1/2001 | Tzeng et al. | |
| 6,295,721 B1 | 10/2001 | Tsai | |
| 6,300,232 B1 | 10/2001 | Satoh | |
| 6,448,113 B2 | 9/2002 | Lee et al. | |
| 6,573,125 B2 | 6/2003 | Bae | |
| 6,642,135 B2 | 11/2003 | Kim et al. | |
| 6,713,837 B1 | 3/2004 | Mori et al. | |
| 6,716,679 B2 | 4/2004 | Bae | |

FOREIGN PATENT DOCUMENTS

| KR | 10-2001-0037795 | 5/2001 |
|---|---|---|
| KR | 10-2001-0061081 | 7/2001 |

OTHER PUBLICATIONS

"Translation of an Official Action as issued by the German Patent and Trademark Office," corresponding to German Patent application 103 50 510.5-33, mailed May 11, 2005.

*Primary Examiner*—Roy K Potter
(74) *Attorney, Agent, or Firm*—Myers Bigel Sibley & Sajovec PA

(57) ABSTRACT

An integrated circuit device is provided including an integrated circuit substrate having a fuse region. A window layer is provided on the integrated circuit substrate that defines a fuse region. The window layer is positioned at an upper portion of the integrated circuit device and recessed beneath a surface of the integrated circuit device. A buffer pattern is provided between the integrated circuit substrate and the window layer and a fuse pattern is provided between the buffer pattern and the window layer. Methods of forming integrated circuit devices are also described.

9 Claims, 15 Drawing Sheets

METHODS OF FABRICATING INTEGRATED CIRCUIT DEVICES HAVING FUSE STRUCTURES INCLUDING BUFFER LAYERS

RELATED APPLICATIONS

This application is a divisional application of and claims priority to U.S. patent application Ser. No. 10/663,967, filed Sep. 16, 2003 now U.S. Pat No. 7,186,593, which claims priority from Korean Patent Application No. 2002-68933 filed on Nov. 7, 2002, the disclosures of which are hereby incorporated herein by reference as if set forth in their entirety.

FIELD OF THE INVENTION

The present invention relates to integrated circuit devices and methods of fabricating the same and, more particularly, to fuse structures of integrated circuit devices and methods of fabricating the same.

BACKGROUND OF THE INVENTION

Conventional methods of manufacturing integrated circuit devices include a fabrication (FAB) process, i.e., forming cells on a substrate that make up the integrated circuit device, and an assembly process, i.e., packaging the cells on the substrate into chips. Furthermore, an electrical die sorting (EDS) process may be performed between the fabrication process and the assembly process to test electrical properties of the cells formed on the substrate.

In particular, the EDS process may be performed to determine if the cells formed on the substrate are defective. Once the EDS process is completed, the defective cells may be removed before the assembly process is initiated. Thus, implementing the EDS process may reduce the time and effort involved in carrying out the assembly process. In addition, the defective cells may be located in advance and may be repaired and/or regenerated.

A conventional EDS process may include a pre-laser test and a post-laser test. The pre-laser test may be used to identify the defective cells. The post-laser test may be used to repair the identified defective cells and re-test the repaired cells to determine if the repairing process was successful. The process of repairing the cells may include cutting a wiring connected to a defective cell by irradiating a laser beam onto the wiring and replacing the defective cell with a redundancy cell built into the chip. The wiring to be cut by the exposure to the laser beam is typically called a fuse pattern. An insulation layer, i.e. a window layer, for protecting the fuse pattern and defining a fuse portion is typically provided on the fuse pattern.

Examples of conventional fuse patterns are disclosed in U.S. Pat. No. 6,100,117 to Hao et al. and U.S. Pat. No. 6,180,503 to Tzeng et al. As discussed in these patents, a portion of a bit line of an integrated circuit device, for example, an integrated circuit memory device, may be used as the fuse pattern. In other words, the bit line may be extended into a fuse portion of the device and this portion of the bit line may be used as the fuse pattern.

When a portion of the bit line is used as the fuse pattern it may be difficult to form an opening exposing the fuse pattern in the fuse region because the bit line is typically covered by multiple insulation layers, metal wirings and the like. Accordingly, the opening exposing the fuse pattern may be deep and may require additional processing time due to the extra depth. Thus, the overall productivity of the process may be reduced.

Furthermore, it may also be difficult to control a thickness of the window layer when the window layer is disposed in a deep opening.

Alternatively, upper electrodes of capacitors or a metal wiring may be used as the fuse pattern instead of the bit line. An example of using the upper electrode of the capacitor as the fuse pattern is discussed in Korean Patent Laid-Open Publication No. 2001-61081 and an example of using a metal wiring as the fuse pattern is discussed in Japanese Patent Laid-Open Publication No. Hei 11-87646 corresponding to U.S. Pat. No. 6,040,614 to Kitaguchi et al.

When the upper electrode of the capacitor or the metal wiring is used as the fuse pattern, an underlying structure of the fuse pattern may be damaged by a laser beam used to cut the fuse pattern. Accordingly, when the metal wiring is used as the fuse pattern, a buffer layer is typically formed under the fuse pattern to reduce any possible damage that may be caused by the laser beam.

An example of using a metal wiring as the fuse pattern combined with a buffer layer under the fuse pattern is discussed in Korean Patent Laid-Open Publication No. 2001-37795. As discussed therein, the buffer layer is a plug type buffer layer. The plug type buffer layer may be formed by forming a groove on a thin film and providing buffer layer material in the groove. In particular, an insulation layer may be formed on an underlying structure such as a bit line, a portion of the insulation layer may be etched to form a groove and a material for forming a buffer layer may be provided in the groove. A planarizing process, for example, a chemical mechanical polishing (CMP) process, or an etch back process may be performed to remove a portion of the buffer material, thereby allowing the buffer material to remain substantially within the groove to form the buffer layer plug. The fuse pattern may be formed on the insulation layer in which the buffer layer plug is provided.

Thus, according to the teachings of these references, damage caused to the substrate by the laser beam used to cut the fuse pattern may be reduced by the presence of the buffer layer. However, fabrication of the buffer layer plug may be complicated and time consuming. Accordingly, improved fuse structures and methods of manufacturing fuse structures may be desired.

SUMMARY OF THE INVENTION

Embodiments of the present invention provide integrated circuit devices including an integrated circuit substrate having a fuse region. A window layer is provided on the integrated circuit substrate that defines a fuse region. The window layer is positioned at an upper portion of the integrated circuit device and recessed beneath a surface of the integrated circuit device. A buffer pattern is provided between the integrated circuit substrate and the window layer and a fuse pattern is provided between the buffer pattern and the window layer.

In some embodiments of the present invention, the integrated circuit device may further include a metal wiring and the metal wiring may be more remote from the integrated circuit substrate than the window layer. In certain embodiments of the present invention, the buffer pattern may include a first buffer pattern. The device may further include a first insulation layer between the first buffer pattern and the fuse pattern and a second buffer pattern between the first buffer pattern and the integrated circuit substrate. A second insulation layer may also be provided between the first and second buffer patterns.

In further embodiments of the present invention, the fuse pattern may include a first conductive material, the first buffer pattern may include a second conductive material and the second buffer pattern may include a third conductive material. The second and third conductive materials may be different from the first conductive material and the first and second buffer patterns may be planar. In certain embodiments of the present invention, the first conductive material may include aluminum, tungsten and/or copper, the second conductive material may include polysilicon, ruthenium, platinum, iridium, titanium nitride, tantalum nitride and/or tungsten nitride and the third conductive material may include polysilicon, ruthenium, platinum, iridium, titanium nitride, tantalum nitride and/or tungsten nitride.

In still further embodiments of the present invention, the device may further include a line pattern between the integrated circuit substrate and the second insulation layer adjacent the second buffer pattern. A contact hole may be provided in the first and second insulation layers and a contact plug may be positioned in the contact hole. The contact plug may electrically couple the fuse pattern to the line pattern.

In some embodiments of the present invention, a conductive layer pattern may be provided on the second insulation layer between the second insulation layer and the first insulation layer adjacent the first buffer pattern. A third insulation layer may also be provided on the first insulation layer and the fuse pattern. A metal wiring may further be provided on the third insulation layer above the conductive layer pattern. A via hole may be provided in the first and third insulation layers and a conductive plug may be positioned in the via hole. The conductive plug may electrically couple the conductive layer pattern and the metal wiring.

In further embodiments of the present invention, the integrated circuit device may be an integrated circuit memory device. While the present invention is described above primarily with reference integrated circuit devices, methods of fabricating integrated circuit devices are also provided herein.

DETAILED DESCRIPTION

Figure 1A:
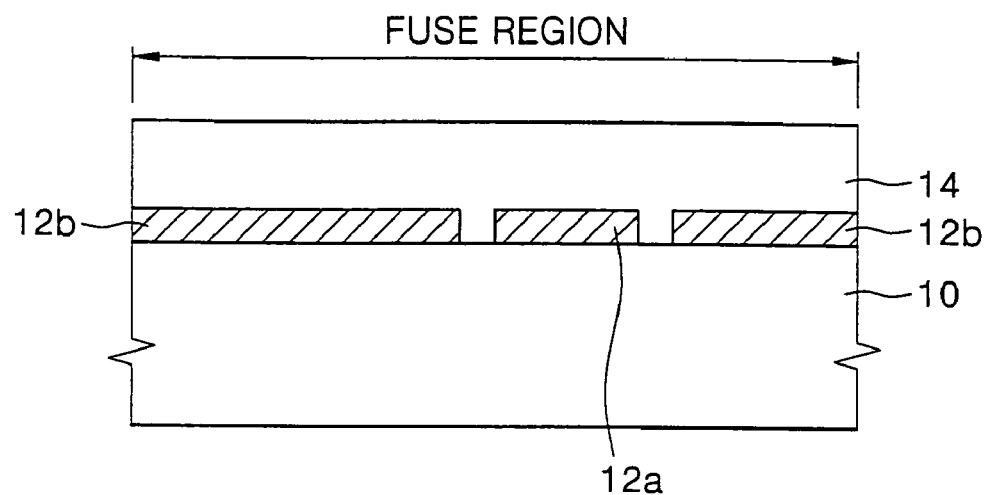
FIGS. 1A through 1G are cross-sectional views illustrating processing steps in the fabrication of integrated circuit devices according to some embodiments of the present invention.

The present invention now will be described more fully hereinafter. with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 1 through 3J. Embodiments of the present invention provide a buffer pattern on an integrated circuit substrate in the fuse region, a fuse pattern on the buffer pattern and a window layer on the fuse pattern defining the fuse region. The window layer is positioned at an upper portion of the integrated circuit device and is recessed beneath a surface of the integrated circuit device. Positioning the fuse pattern at the upper portion of the device may simplify the etching process as the etch would not typically. have to be very deep to open the fuse region. Furthermore, providing at least one buffer pattern below the fuse pattern may reduce any impact a laser test may have on the integrated circuit substrate. Thus, integrated circuit devices and related methods according to embodiments of the present invention may provide improved fuse structures and methods of fabricating fuse structures as discussed further below.

Referring now to FIGS. 1A through 1G, cross-sectional views illustrating processing steps in the fabrication of integrated circuit devices according to some embodiments of the present invention will be discussed. As illustrated in FIG. 1A, a substrate 100 having a fuse region is formed. The substrate may have a lower part structure that includes a transistor and a bit line. In embodiments of the present invention illustrated in FIG. 1A, the bit line extends into the fuse region and is patterned. As further illustrated, the bit line includes a buffer pattern 12a and a line pattern 12b. The buffer pattern 12a and the line pattern 12b may include, for example, polysilicon, ruthenium (Ru), platinum (Pt), iridium (Ir), titanium nitride (TiN), tantalum nitride (TaN), tungsten nitride (WN) and the like. An insulation layer 14 may be formed or deposited on the buffer pattern 12a, the line pattern 12b and the substrate 100. The insulation layer 14 may be, for example, an interlayer dielectric layer such as an oxide layer.

Figure 1B:
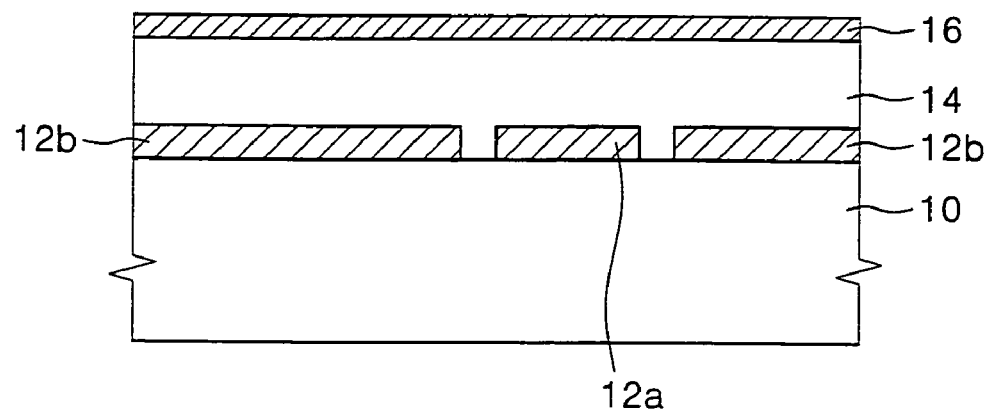

Referring now to FIG. 1B, a conductive layer 16 is formed on the insulation layer 14. As illustrated in FIG. 1B, the conductive layer 16 may be formed by, for example, depositing an upper electrode layer on the integrated circuit substrate extending from the cell region to the fuse region. It will be understood that in some embodiments of the present invention the upper electrode layer may not extend into the fuse region.

Figure 1C:
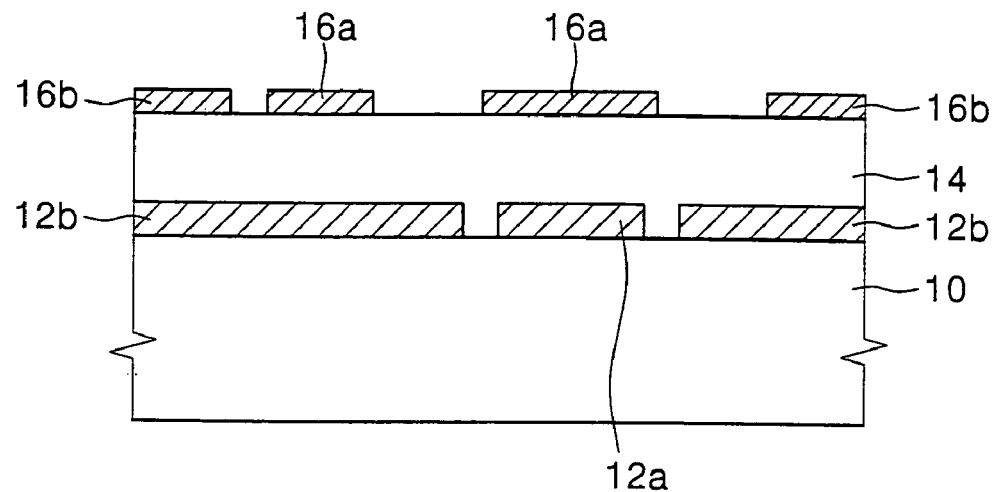

Referring now to FIG. 1C, the conductive layer 16 is patterned using, for example, a photolithography process, to form an upper electrode 16b of a capacitor and a buffer pattern 16a. After patterning, the conductive layer 16 (upper electrode 16b and buffer pattern 16a) remains above the buffer pattern 12a and the line pattern 12b. Thus, buffer pattern 16a may be termed a first or upper buffer pattern 16a and the buffer pattern 12a may be termed a second or lower buffer pattern 12a. Similar to the lower buffer pattern 12a, the upper buffer pattern 16a may include polysilicon, Ru, Pt, Ir, TiN, TaN, WN and the like. The upper electrode (conductive layer 16b) remaining above the lower buffer pattern 12a may be used to electrically couple a subsequently formed guard ring pattern to a metal wiring as will be described below.

Figure 1D:
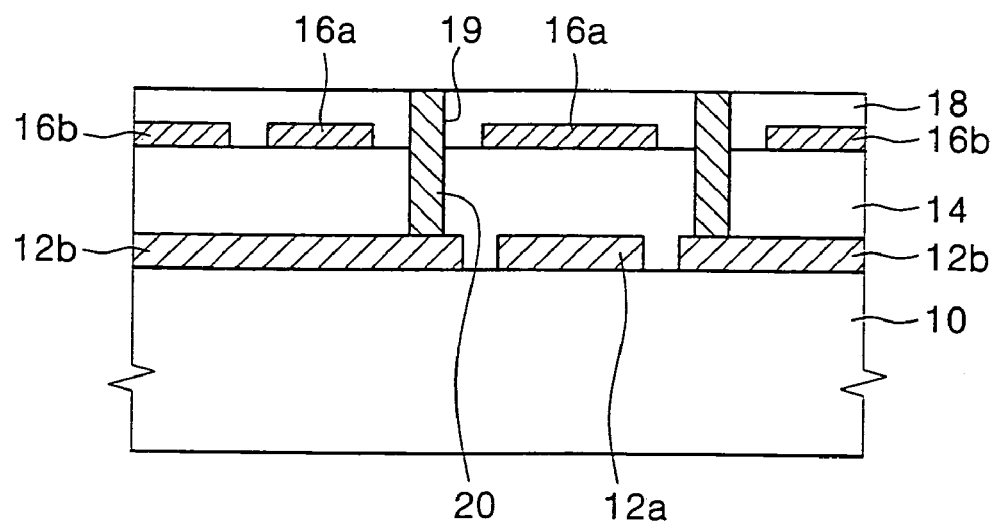

Referring now to FIG. 1D, an insulation-layer 18 is formed (deposited) on the on the insulation layer 14, the upper buffer pattern 16a and the upper electrode 16b. The insulation layer 18 may be termed the first insulation layer 18 corresponding to the first or upper buffer pattern 16a and the insulation layer 14 formed between the first buffer pattern 16a and the second buffer pattern 12a may be termed the second insulation layer 14. The first insulation layer 18 may be, for example, an oxide layer. As illustrated in FIG. 1D, the first and second insulation layers 18 and 14 are subsequently etched using, for example, a photolithography process to form a contact hole 19. The contact hole 19 may be formed adjacent the first buffer pattern 16a and may expose a portion of a surface of the line pattern 12b.

A conductive material is deposited on the first insulation layer 18 having the contact hole. The deposited conductive material layer is removed using, for example, a planarization method such as a chemical mechanical polishing method or an etch back process, to expose a portion of the first insulation layer 18. A conductive material may be provided in the contact hole 19 as illustrated in FIG. 1D. The conductive material in the contact hole 19 is a contact plug 20 that may be used to electrically couple the line pattern 12b with a subsequently formed fuse pattern discussed further below. The contact plug may include, for example, aluminum, tungsten, copper, polysilicon and the like.

Figure 1E:
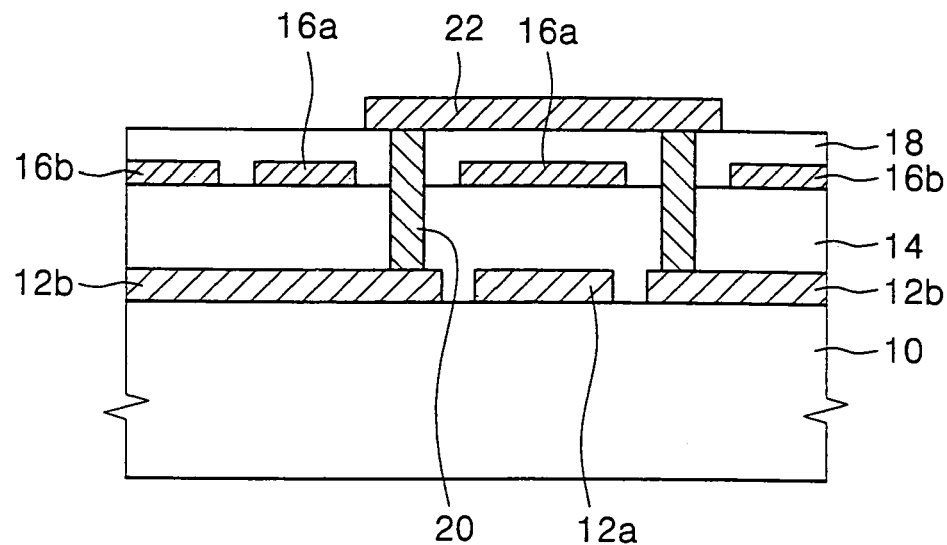

Referring now to FIG. 1E, a conductive layer is formed on the first insulation layer 18 including the contact plug 20. The conductive layer is patterned to form a fuse pattern 22. The fuse pattern 22 may be formed simultaneously with a metal wiring (not shown) that electrically couples to the lower part structure including the transistor and the bit line. In other words, a metal layer may be formed to extend into the fuse region. The metal layer may be patterned to form a metal wiring (not shown) and a fuse pattern 22. As illustrated in FIG. 1E, the fuse pattern 22 is positioned above the second buffer pattern 12a and the first buffer pattern 16a and is electrically coupled to the bit line pattern 12b through the contact plug 20. The fuse pattern 22 and the metal wiring may include aluminum, tungsten, copper pattern and the like.

Figure 1F:
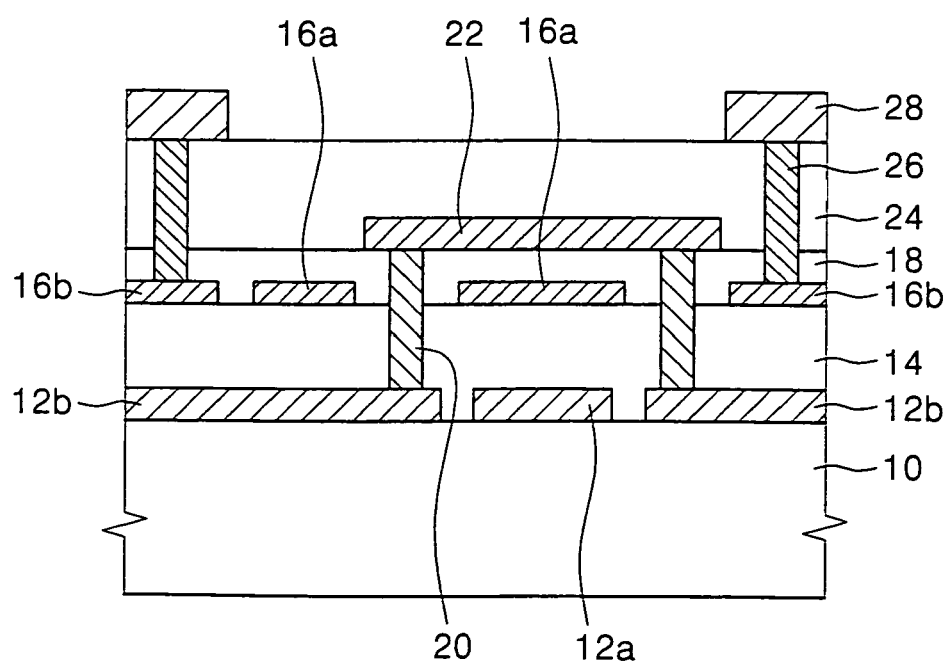

Referring now to FIG. 1F, a third insulation layer 24 is formed (deposited) on the first insulation layer 18 and the fuse pattern 22. A via hole that exposes a portion of the surface of the metal wiring formed at the exterior portion of the fuse pattern 22 is formed using, for example, a photolithography process. A conductive material may be provided in the via hole to provide a conductive plug 26. A metal wiring 28 may be formed on the third insulation layer 24 and the conductive plug 26. The metal wiring 28 may be electrically coupled to the upper electrode 16b through the conductive plug 26. In some embodiments of the present invention, the integrated circuit device may be a dynamic random access memory (DRAM) device. The fuse pattern 22 according to embodiments of the present may be included in the DRAM device. In these embodiments, the metal wiring may include first and second metal layers. The via hole formed at the fuse region having the conductive plug 26 therein functions as a guard ring for reducing absorption of moisture into the fuse pattern and enables an electrical connection.

Figure 1G:
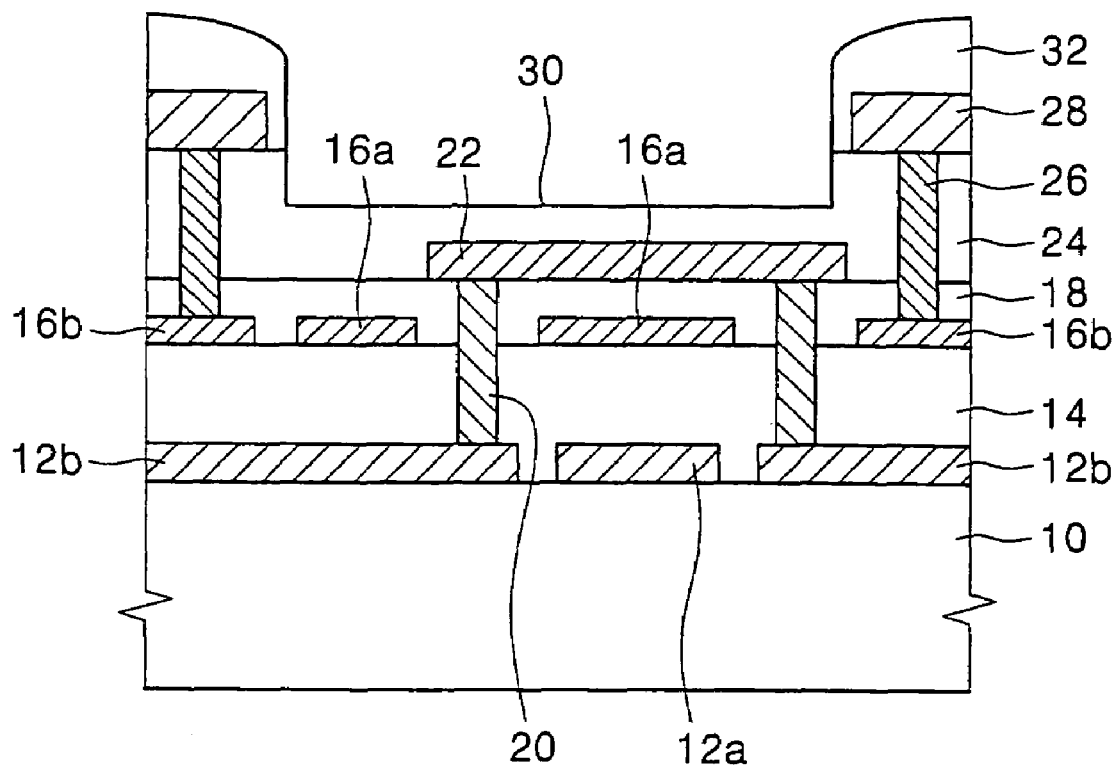

Referring now to FIG. 1G, a passivation layer 32 is formed on the third insulation layer 24 including the metal wiring 28. The passivation layer 32 and the third insulation layer 24 in the fuse region are etched using, for example, a photolithography process such that a portion of the third insulation layer 24 remains above the fuse pattern 22. Accordingly, a window layer 30 may be provided on the fuse pattern 22 that is recessed from the surface of the integrated circuit device and positioned in the upper portion of the integrated circuit device. In other words, as illustrated in FIG. 1G, the window layer 30 is recessed beneath the metal wiring 28 and the passivation layer 32 on the metal wiring 28.

Figure 2:
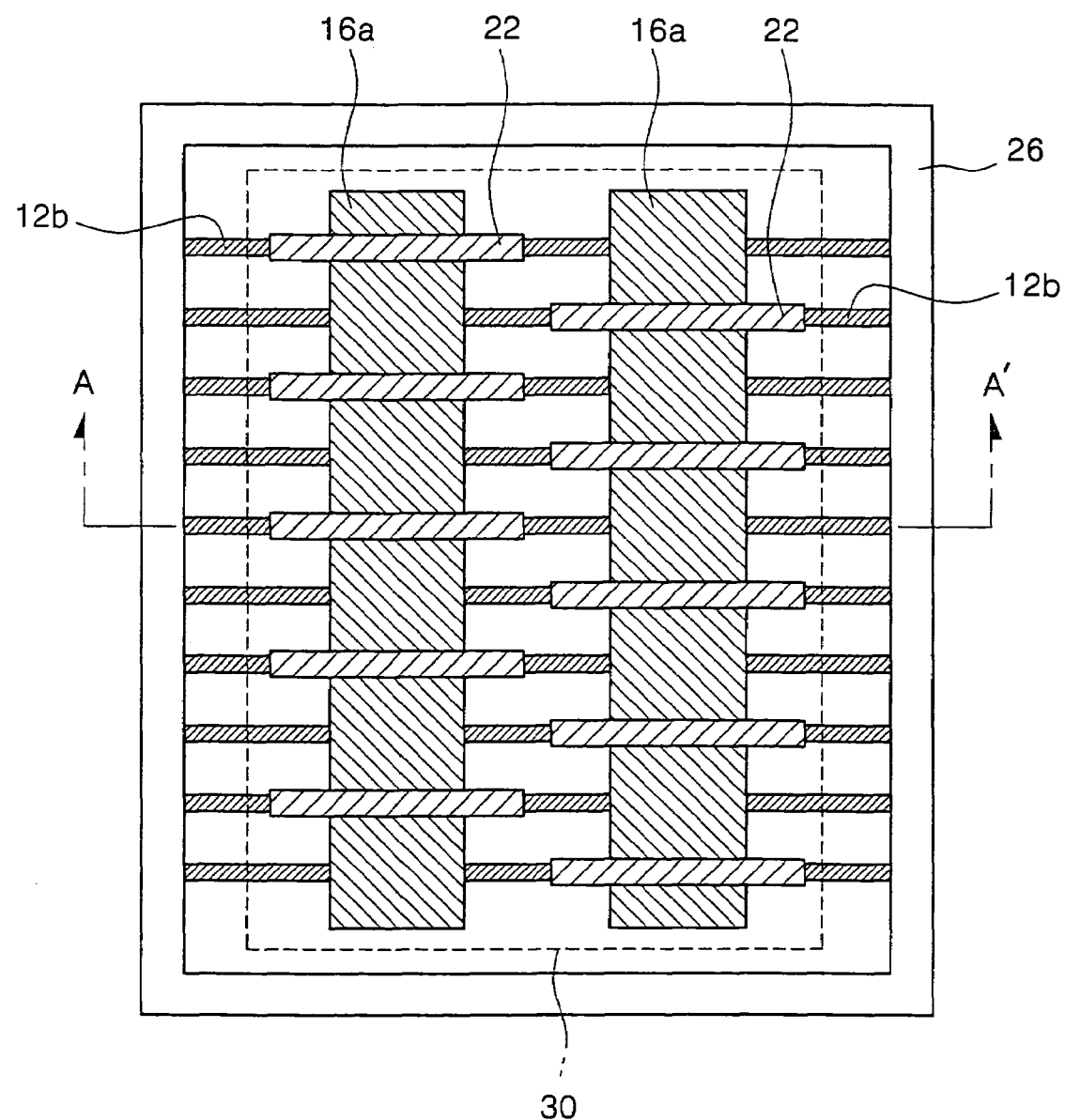
FIG. 2 is a planar view of fuse structures according to embodiments of the present invention illustrated in FIG. 1G.

Referring now to FIG. 2, a plan view of the fuse structure illustrated in FIG. 1G will be discussed. FIG. 1G illustrates a cross-sectional view cut along the line A-A' of FIG. 2. Referring now to FIGS. 1G and 2, the fuse structure includes the window layer 30, the fuse pattern 22, the first buffer pattern 16a and the second buffer pattern 12a. In addition, the first insulation layer 18 and the second insulation layer 14 may also provide a buffering function. Accordingly, during a repairing process an impact applied to the substrate by a laser beam may be relieved (reduced or absorbed) by the first buffer pattern 16a, the second pattern 12a, the first insulation layer 18 and/or the second insulation layer 14. Since the fuse pattern 22 is provided at the upper portion of the integrated circuit device, the window layer 30 may be etched to open the fuse region more efficiently. Furthermore, since the passivation layer 32 and underlying third insulation layer 24 are etched in the fuse region, the thickness of the resulting window layer 30 may be more easily controlled and the time required for the etching the window layer 30 may be reduced.

Figure 3A:
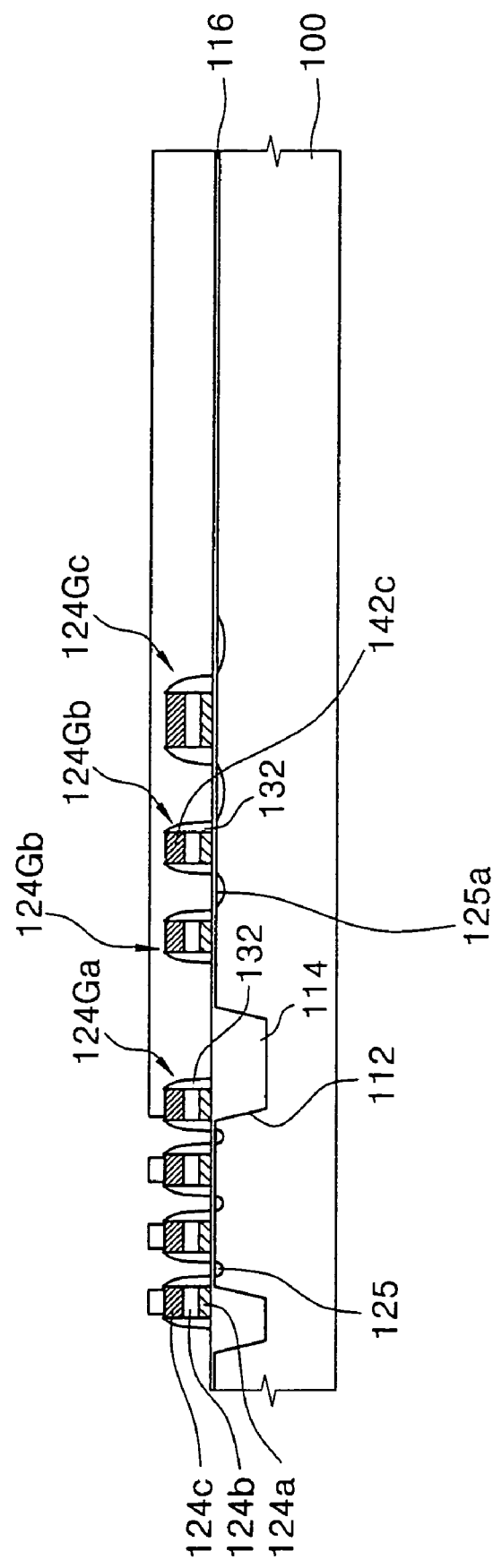
FIGS. 3A through 3J are cross-sectional views illustrating processing steps in the fabrication of Dynamic Random Access Memory (DRAM) devices according to some embodiments of the present invention.

Referring now to FIGS. 3A through 3J, cross-sectional views illustrating processing steps in the fabrication of DRAM devices according to some embodiments of the present invention will be discussed. As illustrated in FIG. 3A, a substrate 100 is formed. The substrate 100 may be, for example, a p-type substrate formed of an integrated circuit material such as silicon. A trench 112 having a depth of from about 4,000 Å to about 5,000 Å and a width of from about 1,000 Å to about 1,500 Å is formed at an upper portion of the substrate 100 by, for example, etching an isolation region. An oxide thin film is formed or deposited on the substrate 100 having the trench 112. The oxide thin film may be formed by, for example, forming a spin on glass (SOG) layer (not shown). In particular, an SOG solution may be coated on the substrate 100 to a thickness of from about 6,000 Å to about 7,000 Å and the SOG layer may be cured to obtain a silicon oxide layer. It will be understood that the formation of the oxide film is not limited to this example. For example, the oxide thin film may also be formed by, for example, a chemical vapor deposition method. The silicon oxide layer may be polished by, for example, a chemical mechanical polishing method until the upper surface of the substrate 100 is exposed to obtain an isolation region. The trench 112 having silicon oxide 114 positioned therein.

A well region is formed by, for example, implanting n-type or p-type impurities such as phosphorus (P) or boron (B) into the integrated circuit substrate 100 of a cell region, forming a memory cell and a peripheral circuit region. The surface portion of the exposed substrate 100 is removed using, for example, a fluorine-based cleaning solution and a gate oxide layer 116 is formed at the surface portion of the substrate 100 through, for example, wet oxidizing the substrate 100. The gate oxide layer 116 has a thickness of from about 40 Å to about 200 Å.

On the surface of the substrate 100 on which silicon oxide 114 and the gate oxide layer 116 are formed, a first polysilicon layer having a thickness of from about 500 Å to about 4,000 Å is formed through, for example, depositing n-type impurities including phosphorus (P) doped polysilicon by, for example, a low pressure chemical vapor deposition (LPCVD) method. On the first polysilicon layer, a tungsten silicide layer having a thickness of from about 1,000 Å to about 2,000 Å is deposited by, for example, a chemical vapor deposition method or a sputtering method. On the tungsten silicide layer, a silicon nitride layer is deposited. The silicon nitride layer is formed to a thickness of from about 500 Å to about 2,000 Å by, for example, a low-pressure chemical vapor deposition (LPCVD) method or a plasma enhanced chemical vapor deposition (PECVD) method.

A photoresist film is formed on the silicon nitride layer and is selectively exposed to a light using a pattern mask such as a reticle, i.e. a quartz plate with a pattern delineated in a thin chrome layer on one side that functions like a mask. The photoresist film is developed to form a photoresist pattern (not shown) for forming a gate electrode. The silicon nitride layer, the tungsten silicide layer and the first polysilicon layer are subsequently etched using the photoresist pattern as a mask to form gate electrodes 124Ga, 124Gb and 124Gc including a first polysilicon pattern 124a, a tungsten silicide pattern 124b and a silicon nitride pattern 124c. As illustrated in FIG. 3A, a gate-electrode 124Ga and a word line (not shown) are formed in the cell region and gate electrodes 124Gb and 124Gc are formed at the peripheral circuit region. P-type or n-type impurities such as boron or phosphorus are implanted into the well region of the substrate 100 to form an impurity doped region 125 of a source region and a drain region within wells on both sides of the gate electrodes 124Ga, 124Gb and 124Gc.

A silicon nitride layer having a thickness of from about 200 Å to about 600 Å is formed by, for example, depositing silicon nitride using a chemical vapor deposition method on the substrate 100. The silicon nitride layer is anisotropically etched to form spacers 132 at the sidewall portions of the gate electrodes 124Ga, 124Gb and 124Gc. A thin oxide layer or a silicon nitride layer (not shown) having a thickness of from about 100 Å to about 200 Å is formed by a chemical vapor deposition method on the surface of the structure. An oxide layer having a good step coverage property such as a borophosphosilicate glass (BPSG) layer is formed to a thickness of from about 4,000 Å to about 6,000 Å and is reflowed. The BPSG layer is planarized by, for example, a chemical mechanical polishing method to form a planar insulation layer 126.

A photoresist pattern (not shown) is formed on the planarized insulation layer 126 for forming a contact hole of a bit line at the cell region. A contact hole that exposes at least a portion of an impurity-doped region 125 in the cell region is formed in the planarized insulation layer 126 using the photoresist pattern as an etching mask. A self-aligned bit line contact hole (formed on a drain region) and a self-aligned storage electrode contact hole (formed on a source region) are formed between the gate electrodes in the cell region.

It will be understood that the methods of forming the structure illustrated in FIG. 3A are provided for exemplary purposes only and that the structure illustrated in FIG. 3A may be formed using other methods and processes without departing from the teachings of the present invention.

Figure 3B:
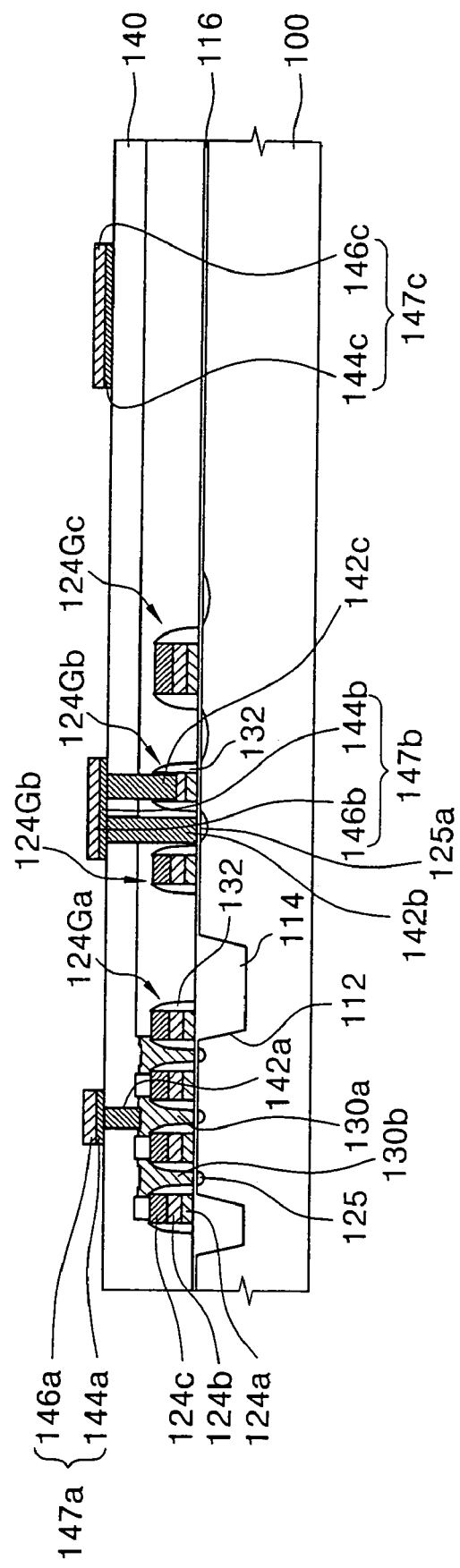

Referring now to FIG. 3B, a second polysilicon layer is formed on the surface of the obtained structure by depositing impurity-doped polysilicon by, for example, a chemical vapor deposition method. The second polysilicon layer is removed by a chemical mechanical polishing method or an etch back method until the planarized insulation layer is exposed, to form a lower part plug of the bit line contact 130b in the bit line contact hole at the drain region and to form a lower part plug of the storage electrode contact 130b in the storage electrode contact hole. An insulation layer, for example, an oxide layer, having a thickness of about 2,000 Å is formed on the surface of the device to obtain a first interlayer dielectric 140.

A photoresist pattern is formed on the first interlayer dielectric for exposing the bit line contact plug 130a, a drain region at the peripheral region and the gate electrode. The first interlayer dielectric 140 is anisotropically etched using the photoresist pattern as an etching mask to form a contact hole that exposes at least a portion of the lower part plug of bit line contact 130a. The planarized insulation layer remaining under the first interlayer dielectric 140 is also etched after the first interlayer dielectric 140 to form contact holes exposing the drain region 125a and the gate electrode 124Gb at the peripheral region.

A metal layer, for example, tungsten, is formed in the contact holes using, for example, a sputtering method. The metal layer is planarized by an etch back method or a chemical mechanical polishing method exposing the first interlayer dielectric 140. An upper part plug of the bit line contact 142a is formed in the contact hole in the cell region and a drain contact plug 142b and a gate electrode contact plug 142c are formed in the contact holes in the peripheral circuit region. A conductive material is formed on the first interlayer dielectric 140 to form a conductive layer. The conductive material may include, for example, an impurity doped polysilicon, a metal such as tungsten, aluminum and/or titanium and/or a metal compound such as titanium nitride or tungsten silicide. According to some embodiments of the present invention, the conductive layer may be formed to have a polycide structure by depositing impurity doped polysilicon and a metal silicide such as tungsten silicide.

The conductive layer is patterned using, for example, a photolithography process to form a bit line 147a connected to the upper part plug of the bit line contact 142a and including a first polysilicon pattern 144a and a first silicide pattern 146a at the cell region. At the peripheral circuit region, a wiring 147b is formed coupled to the drain contact plug 142b and the gate electrode contact plug 142c and includes a second polysilicon pattern 144b and a second metal silicide pattern 146b. A buffer pattern 147c that extends from the bit line 147a and includes a third polysilicon pattern 144c and a third metal silicide pattern 146c is formed at the fuse region of the peripheral circuit region. This buffer pattern 147c is formed to be below a subsequently formed fuse pattern to reduce an impact on the substrate 100 applied by a laser beam. The buffer pattern 147c at the fuse region is formed simultaneously with the bit line at the cell region. A line pattern is also formed around the buffer pattern 147c simultaneously with the bit line, however, the line pattern is not illustrated in this cross-sectional view of FIG. 3B.

Figure 3C:
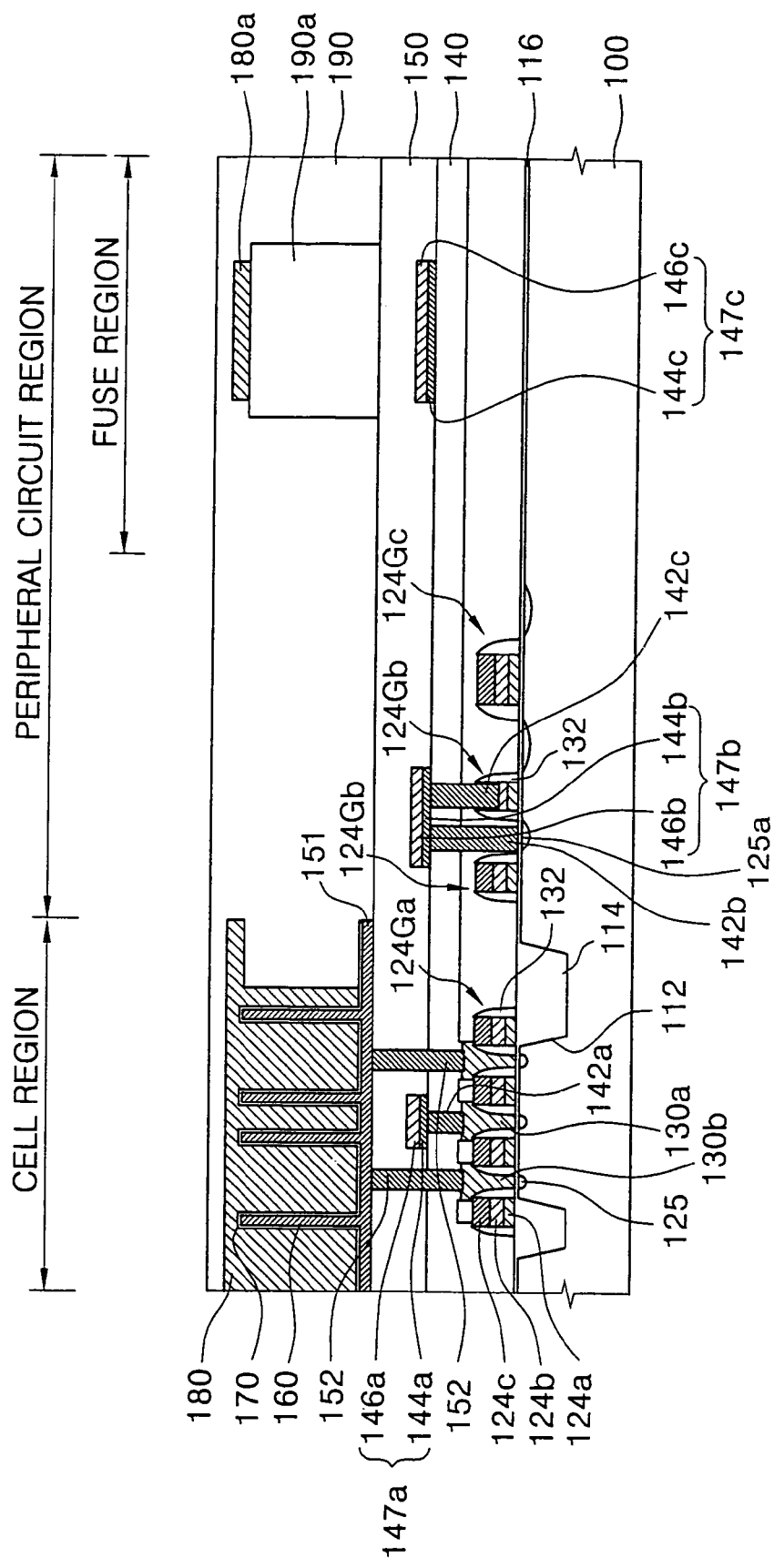

Referring now to FIG. 3C, an insulation layer, for example, BPSG, is deposited to a thickness of from about 3,000 Å to about 5,000 Å on the first interlayer dielectric 140, the bit line 147a, the wiring 147b and the buffer pattern 147c. The BPSG is reflowed by, for example, a heat treatment and a planar second interlayer dielectric 150 is formed using, for example, a chemical mechanical polishing method.

A capacitor of an integrated circuit memory device is formed on the second interlayer dielectric 150 at the cell region. In particular, an etch stop layer 151 including, for example, a nitride compound, is formed on the planar second interlayer dielectric 150 to reduce the likelihood that the second interlayer dielectric 150 will be etched during the etching of the sacrificial layer. The second interlayer dielectric 150 is etched using, for example, a photolithography process to form a contact hole that exposes at least a portion of a lower part plug of a storage electrode contact 130*b*. A first conductive layer (not shown) is provided on the second interlayer dielectric 150 and in the contact hole. The first conductive layer is formed by depositing an impurity doped polysilicon by, for example, a low pressure chemical vapor deposition method. The first conductive layer is etched by, for example, a chemical mechanical polishing method or an etch back process to form an upper part plug of a storage electrode contact 152 connected to the lower part plug of the storage electrode contact 130*b* in the contact hole.

A sacrificial layer (not shown), for example, an oxide compound, is formed on the upper part plug of the storage electrode contact 152 and the second interlayer dielectric 150. The oxide compound may include, for example, BPSG, PSG, undoped silicon glass (USG) and the like. The sacrificial layer may be formed by, for example, depositing BPSG to a thickness of from about 10,000 to about 13,000 Å on the substrate 100 on which the transistor is formed using a reaction gas of TetraEthylOrthoSilicate (TEOS). A photoresist film is formed on the sacrificial layer and a photoresist pattern for a storage electrode is formed using a photo process. The sacrificial layer and the etch stop layer 151 are partially etched using the photoresist pattern as an etching mask to form an opening exposing at least a portion of the upper part plug of the storage electrode contact 152. In some embodiments of the present invention, the upper part plug of the storage electrode contact 152 and a portion of the second interlayer dielectric 150 around the upper part plug 152 are exposed by the opening. The photoresist pattern is removed and a second conductive layer is formed on the upper part plug of the storage electrode contact 152, on the side wall portion of the exposed sacrificial layer by the opening and on the surface of the sacrificial layer. The second conductive layer is formed by depositing polysilicon to a thickness of about 500 Å by, for example, a low pressure chemical vapor deposition method. A polysilicon layer having one well (or a groove) for each cell is formed to obtain a second conductive layer including a concave portion.

In order to increase a surface area, a hemispherical grain (HSG) layer may be formed on the second conductive layer. In these embodiments of the present invention, the HSG layer is formed within a pressure-reduced chemical vapor deposition chamber in which a vacuum or a pressure of about $10^{-7}$ Torr or less and a temperature of from about 400 to about 600° C. are maintained. The HSG layer may be formed to a thickness of from about 300 Å to about 500 Å on the inner sidewall surface and lower surface of the second conductive layer. Undoped silicate glass is deposited as a passivation layer on the second conductive layer by a low pressure chemical vapor deposition method. The passivation layer functions to protect the HSG layer formed on the second conductive layer and/or the second conductive layer during an etching process for forming a storage electrode. The passivation layer is provided in the well (or groove) of the second conductive layer and has a relatively planar surface.

The passivation layer, the conductive layer and the HSG layer are simultaneously etched back. The etch back process may be implemented utilizing, for example, a transformer coupled plasma (TCP) polysilicon etching instrument. A mixed gas of carbon tetra-fluoride and nitrogen may be used as an etching gas. A residue of the passivation layer may remain within the well. The second conductive layer formed on the sacrificial layer is etched to form a storage electrode 160 having a second conductive layer pattern of a cylindrical shape for each cell. A wet etching process using an etching solution such as a buffered oxide etchant (BOE) for removing silicon oxide may be performed to remove the residue of the passivation layer remaining within the well of the storage electrode 160 and the sacrificial layer. A dielectric layer 170 is formed on the storage electrode.

A third conductive layer having a thickness of about 2,000 Å is formed by depositing an impurity doped polysilicon on the dielectric layer 170 by, for example, the same method used in the formation of the second conductive layer. The third conductive layer is patterned via a photolithography process to remove the third conductive layer formed at the peripheral circuit region and to form a plate electrode 180 at the cell region. A portion of the third conductive layer remains at the fuse region to form a buffer pattern 180*a*. The buffer pattern 180*a* is obtained by, for example, forming an insulation layer 190*a* at the fuse region and patterning the third conductive layer so as to allow the third conductive layer to remain on the insulation layer 190*a* when the plate electrode 180 is formed. In certain embodiments of the present invention, the buffer pattern 180*a* at the fuse region and the plate electrode 180 at the cell region may be formed simultaneously. In some embodiments of the present invention, the insulation layer 190*a* for forming the buffer pattern 180*a* at the fuse region is omitted and the buffer pattern 180*a* is formed on the second interlayer dielectric 150 at the fuse region. In these embodiments of the present invention, the buffer pattern 180*a* is still formed below a portion where a fuse pattern will be subsequently formed so as to possibly relieve an impact applied by a laser beam.

An insulation layer, for example, BPSG, is deposited on the second interlayer dielectric 150 to a thickness of from about 17,000 Å to about 29,000 Å and is reflowed. The BPSG layer is planarized by, for example, a chemical mechanical polishing method or an etch back method to form a third interlayer dielectric 190.

Figure 3D:
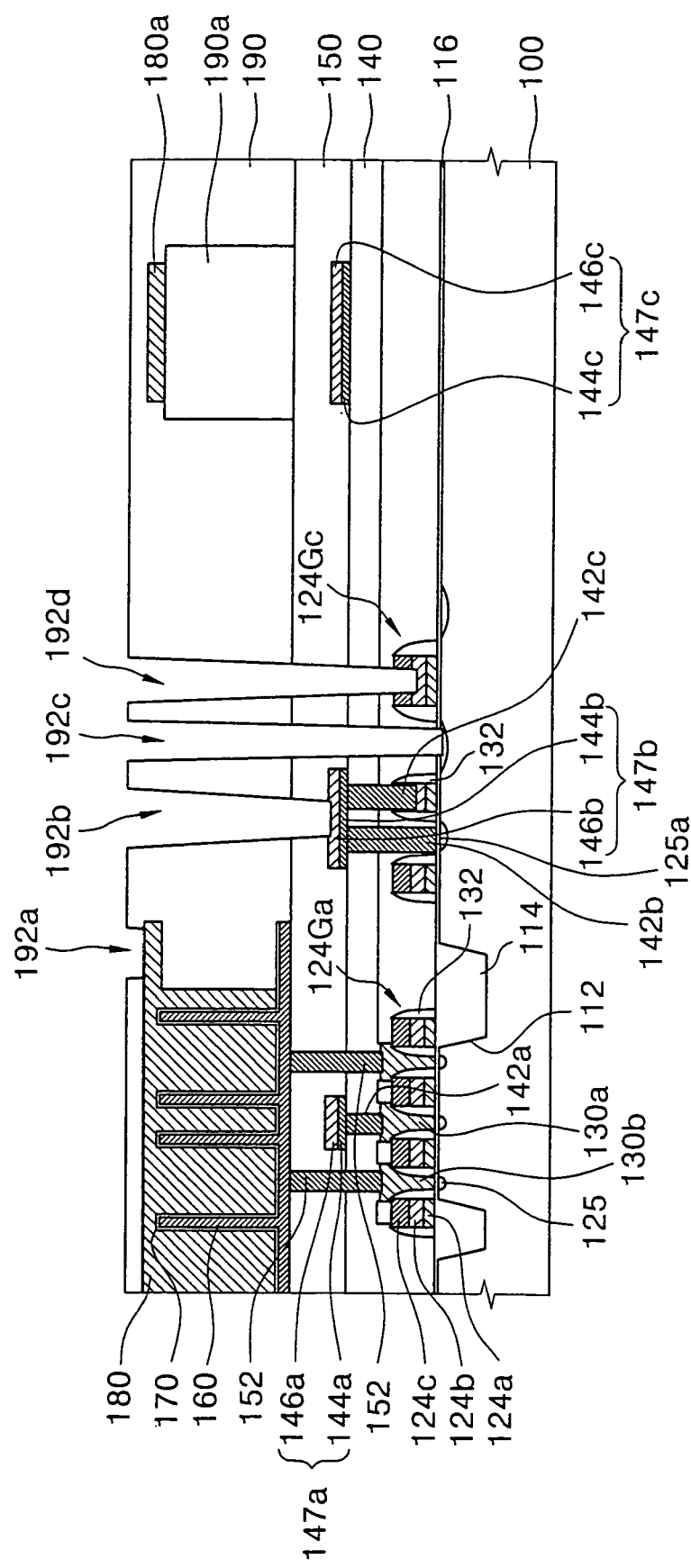

Referring now to FIG. 3D, a photoresist pattern for contact holes is formed on the third interlayer dielectric 190. The third interlayer dielectric 190, the second interlayer dielectric 150 and the first interlayer dielectric 140 are partially and anisotropically etched using the photoresist pattern as an etching mask to form the contact holes. A plate contact hole 192*a* that electrically couples a wiring to the plate electrode 180 and peripheral contact holes 192*b*, 192*c* and 192*d* that electrically couples a wiring to peripheral circuit devices are formed.

Figure 3E:
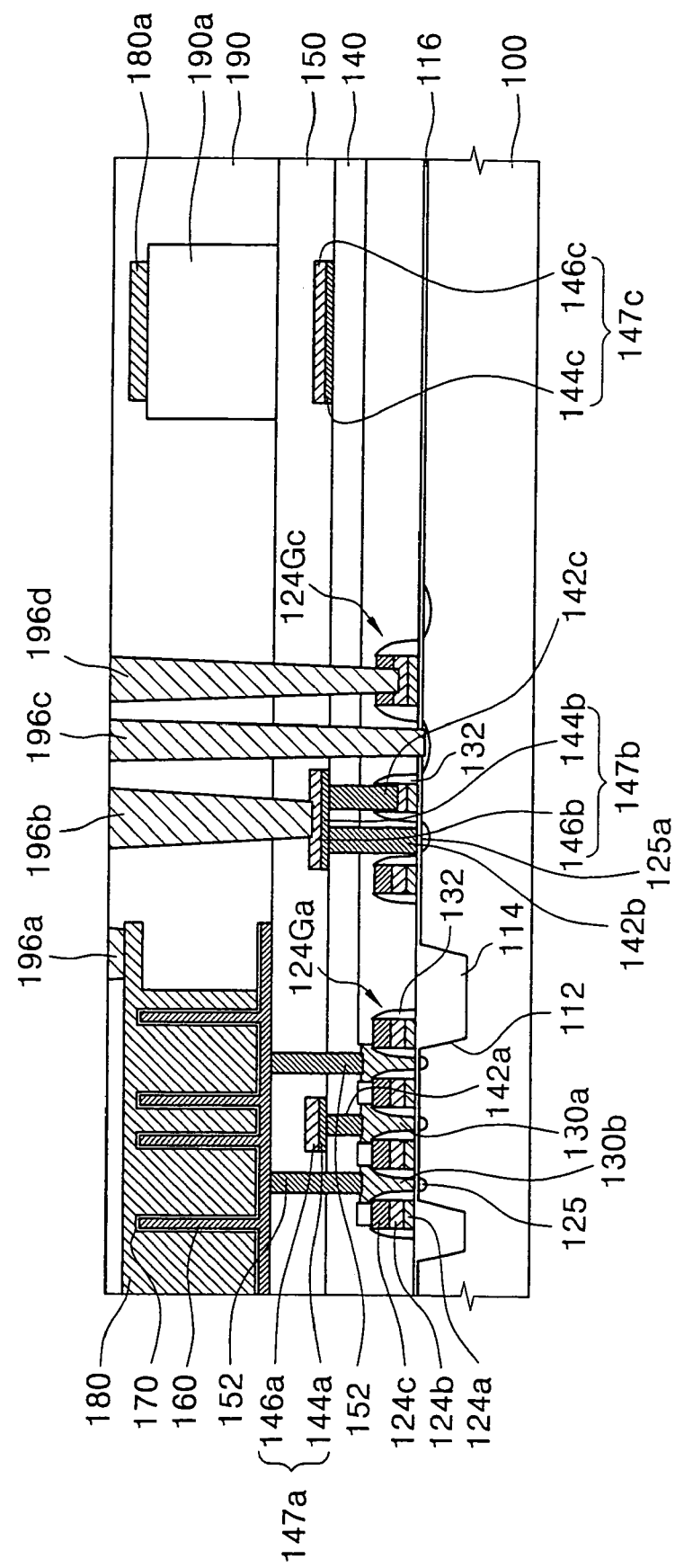

Referring now to FIG. 3E, a barrier layer (not shown) including a refractory metal or a refractory metal compound such as titanium, tantalum, titanium nitride, tantalum nitride, and the like or a composite layer of the refractory metal and the refractory metal compound is deposited on the surface of the device. For example, tungsten is provided in the plate contact hole 192*a* and the peripheral circuit contact holes 192*b*, 192*c* and 192*d* by, for example, a sputtering method, to form a first tungsten layer (not shown). The first tungsten layer is etched back until the third interlayer dielectric 190 is at least partially exposed. A plate contact plug 196*a* is formed in the plate contact hole 192*a* and peripheral contact plugs 196*b*, 196*c* and 196*d* are formed in the peripheral circuit contact holes 192b, 192c and 192c as illustrated in FIG. 3E. At the fuse region, a contact hole that exposes at least a portion of the line pattern (not shown) is formed and a plug is formed in the contact hole. The contact hole and the plug are formed simultaneously with the plate contact plug 196a and the peripheral circuit contact plugs 196b, 196c and 196d.

Figure 3F:
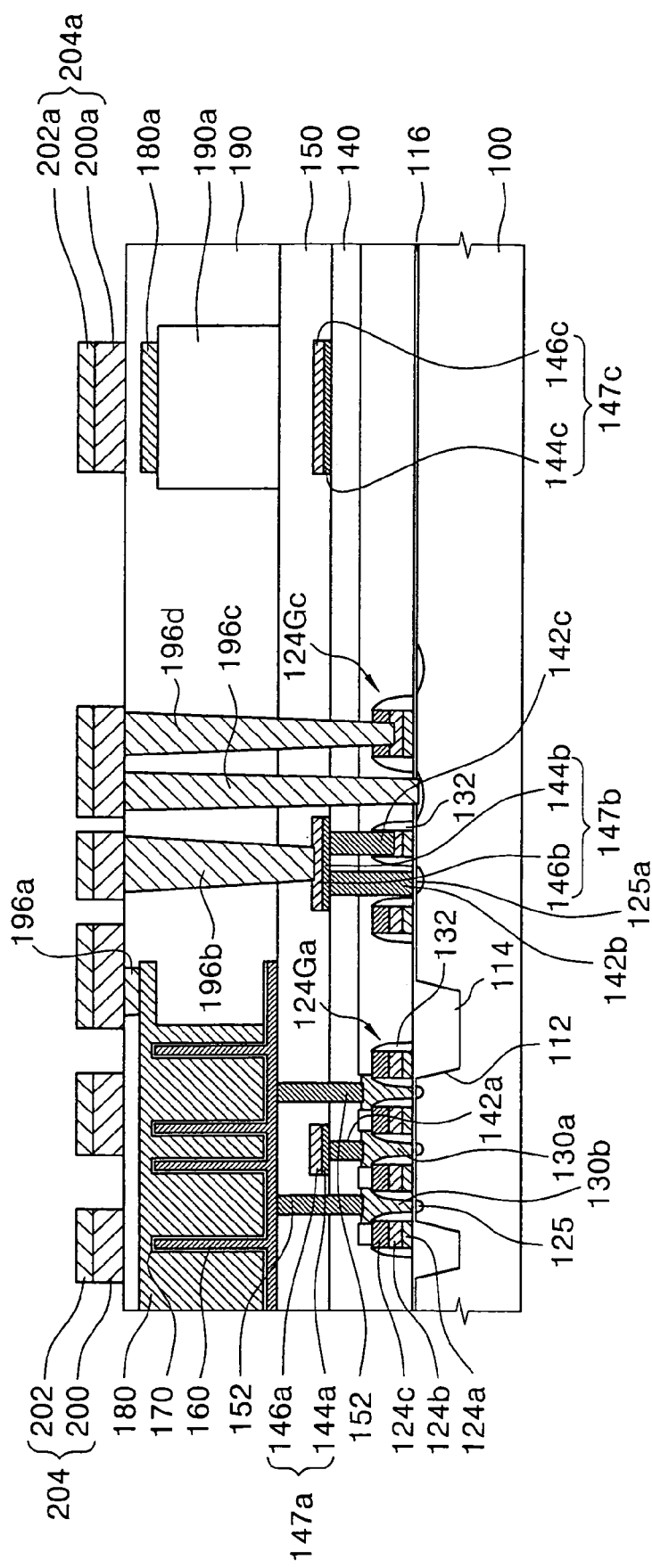

Referring now to FIG. 3F, a first metal layer making contact with the plate contact plug 196a and the peripheral circuit contact plugs 196b, 196c and 196d is formed on the surface of the third interlayer dielectric 190 by, for example, depositing a metal including aluminum, tungsten, titanium and the like, preferably aluminum to a thickness of about 4,000 Å by a sputtering method. Titanium nitride, for example, is deposited on the first metal layer to a thickness of about 1,000 Å to form a first metal compound film.

A photoresist pattern for forming a first metal wiring of an integrated circuit device (corresponding to metal-1 for a DRAM device) is formed on the first metal compound film. A patterning process is performed using, for example, the photoresist pattern as an etching mask to form a first metal wiring 204 including a first metal pattern 200 and a first metal compound pattern 202. The first metal wiring 204 is electrically coupled to the underlying plate contact plug 196a and the peripheral circuit contact plugs 196b, 196c and 196d. A fuse pattern 204a including a first metal pattern 200a and a first metal compound pattern 202a is simultaneously formed at the fuse region.

Figure 3G:
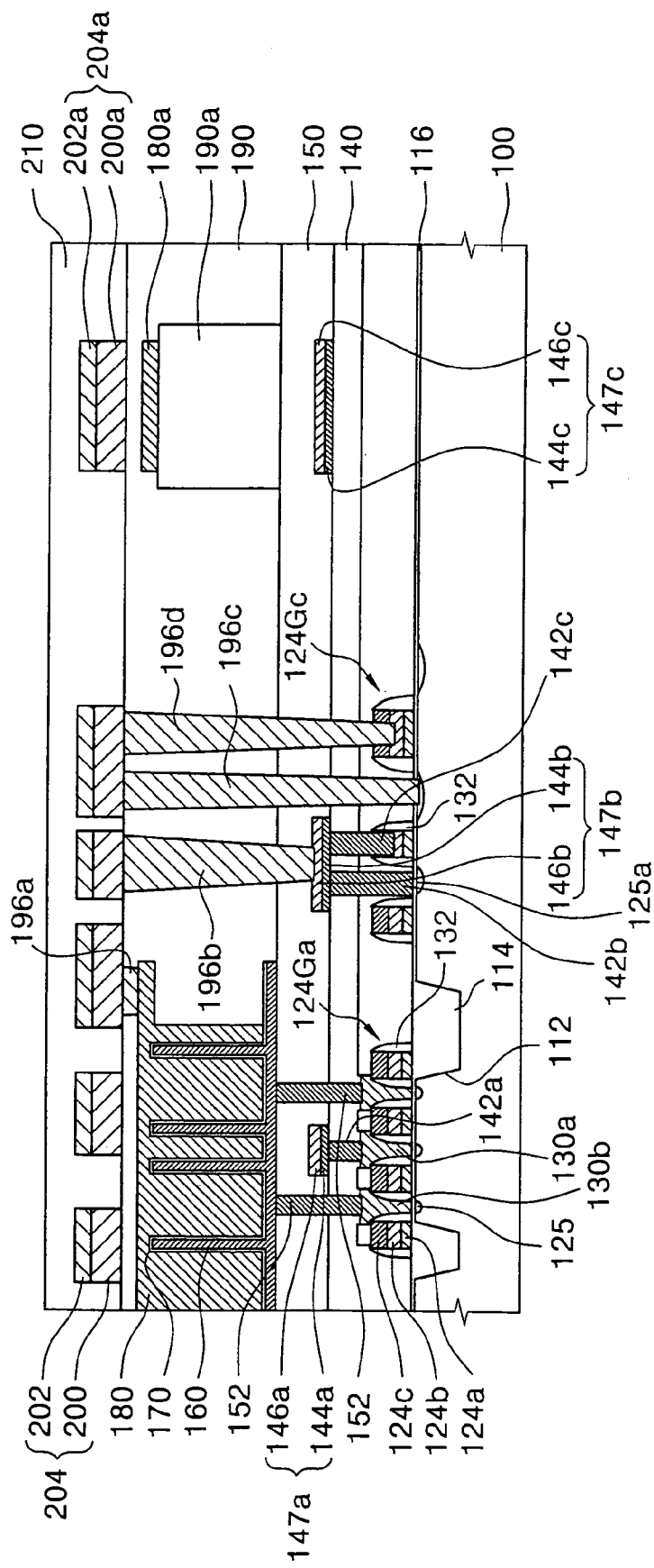

Referring now to FIG. 3G, an oxide using, for example, TEOS, SOG or flowable oxide (FOX), is deposited to a thickness of about 7,000 Å on the third interlayer dielectric 190 to form a fourth interlayer dielectric 210.

Figure 3H:
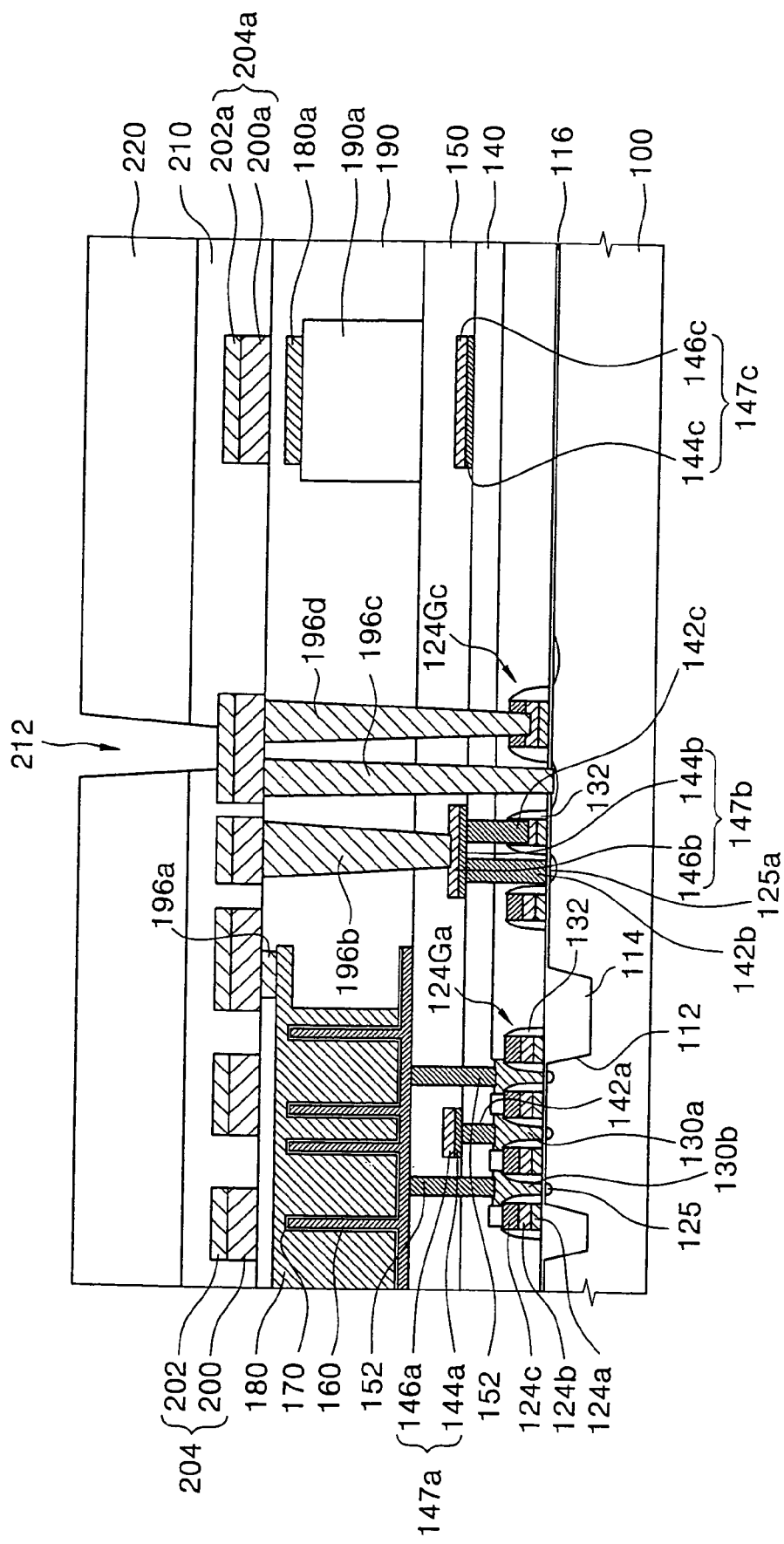

Referring now to FIG. 3H, a photoresist is coated on the fourth interlayer dielectric 210 to form a photoresist film. The photoresist film is exposed and developed to form a photoresist pattern 220 for forming a via hole. The fourth interlayer dielectric 210 is anisotropically etched using the photoresist pattern 220 as an etching mask to form a via hole 212 exposing at least a portion of the second metal wiring (corresponding to metal-2 for a DRAM device). At the fuse region of the peripheral circuit region, a contact hole (not shown) for forming a guard ring pattern is formed. The contact hole is etched until at least a portion of the first metal wiring 204 is exposed, however, an over-etching may be allowed to a certain degree for a correct etching control. In some embodiments of the present invention, a portion of the third interlayer dielectric 190 under the fourth interlayer dielectric 210 may also be etched to form a recess.

Figure 3I:
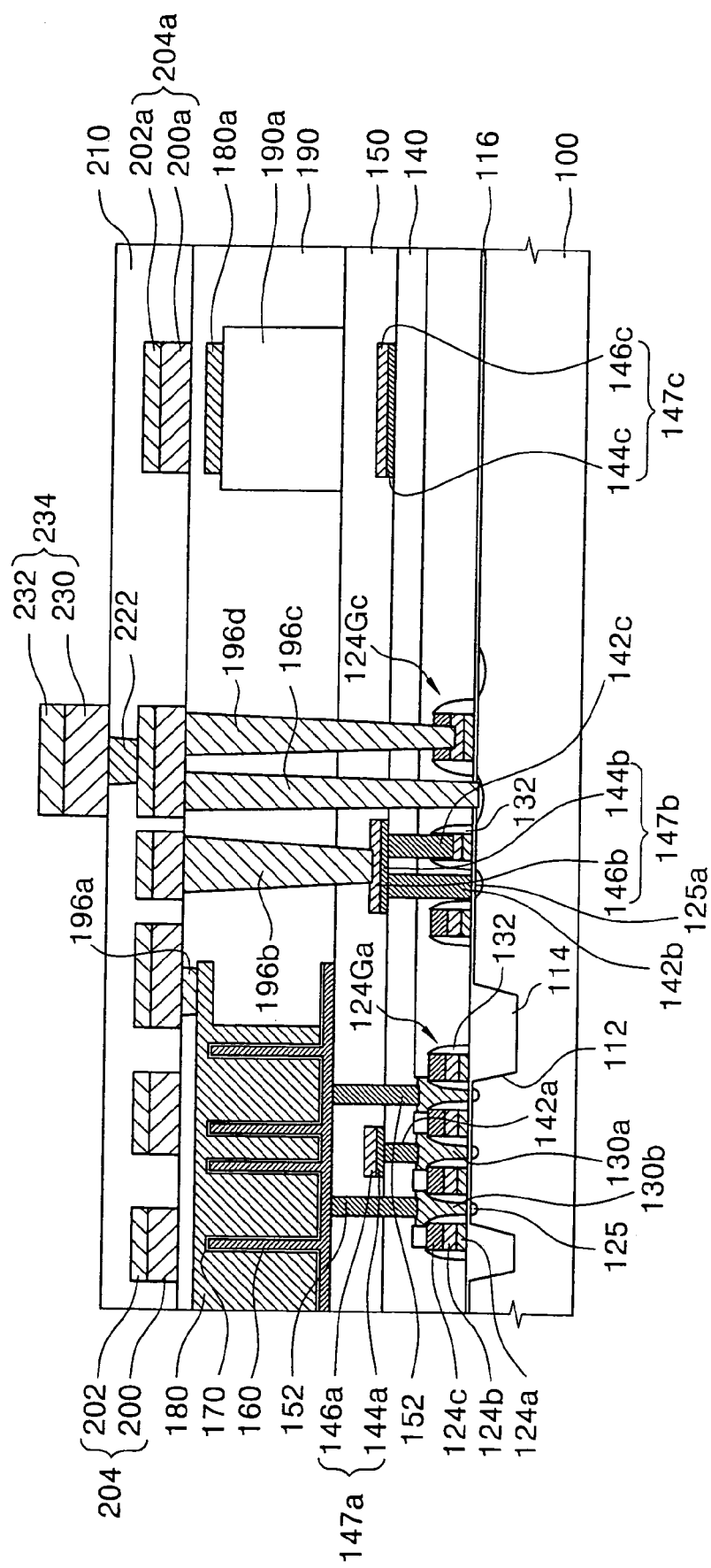

Referring now to FIG. 3I, the photoresist pattern 220 remaining on the fourth interlayer dielectric 210 is removed using, for example, a stripping process. A second tungsten layer may be formed by, for example, depositing tungsten using a sputtering method in the via hole 212 and the contact hole for forming the guard ring pattern. The methods discussed above with respect to the plate contact plug 196a, the peripheral contact plugs 196b, 196c and 196d and the first fuse contact plug 198 may be used. The second tungsten layer is etched back until the fourth interlayer dielectric layer 210 is at least partially exposed. A via contact plug 222 is formed in the via hole 212 as illustrated in FIG. 3I and a plug is also formed in the contact hole for forming the guard ring pattern.

A second metal layer (not shown) making contact with the via contact plug 222 is formed on the fourth interlayer dielectric 210 to a thickness of about 6,000 Å using, for example, by a sputtering method or a chemical vapor deposition method using a metal including, for example, aluminum, tungsten and titanium. Titanium nitride may be formed on the second metal layer to a thickness of about 300 Å to form a second metal compound film (not shown).

A photoresist pattern for forming a second wiring (metal-2) of an integrated circuit device is formed on the second metal compound film and a patterning process is performed using the photoresist pattern as an etching mask to form a second metal wiring 234 including a second metal layer pattern 230 and a first metal compound pattern 232. The second metal wiring 234 may be used to transmit an electric signal from the first metal wiring 204.

Figure 3J:
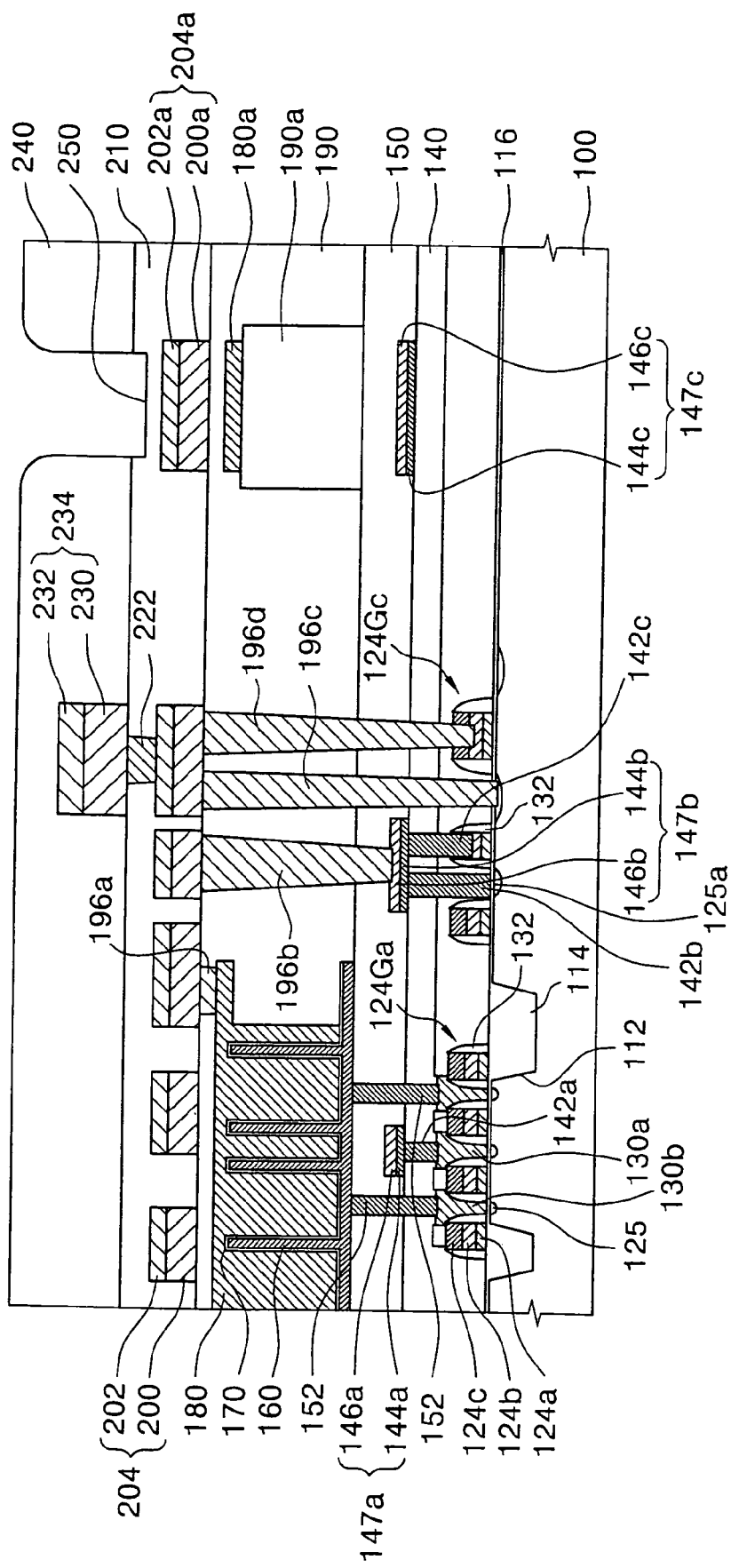

Referring to FIG. 3J, a passivation layer 240 is formed on the surface of the device including the second metal wiring 234. The passivation layer 240 and a portion of the fourth interlayer dielectric 210 formed above the fuse pattern 204a are etched using, for example, a photolithography process to define a fuse region and to form a window layer 250 exposing the fuse region. The window layer 250 is recessed beneath the surface of the integrated circuit device and defines the fuse region at an upper portion of the device.

According to some embodiments of the present invention, a fuse structure including multiple buffer patterns, for example, buffer patterns 147c and 180a, formed at the lower part of the integrated circuit device and a fuse pattern, for example, the fuse pattern 204a, formed at the upper portion of the integrated circuit device may be obtained. In particular, the fuse structure may be formed without performing separate processes. In other words, as discussed above, the buffer patterns 147c and 180a may be formed at the fuse region simultaneously with the bit line and the process of forming the upper electrode of the capacitor, respectively. Furthermore, the fuse pattern 204a may be formed simultaneously with the first metal wiring 204. Accordingly, the fuse structure according to embodiments of the present invention may be formed without any additional processing steps.

As briefly described above with respect to FIGS. 1A through 3J, one or more buffer patterns may be formed without implementing any additional processing steps. Furthermore, since the fuse pattern is formed at an upper portion of the integrated circuit device, the etch used to open the fuse region may be performed more efficiently as the depth and the thickness of the window layer formed at the fuse region can be controlled. Forming the fuse pattern at the upper portion of the device may also reduce the etching time of window layer. Accordingly, fuse structures and methods of forming fuse structures according to embodiments of the present invention may provide increased efficiency in the fabrication process as well as a more reliable device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising:
    forming a conductive layer on an integrated circuit substrate, the conductive layer extending from a cell region to a fuse region of the integrated circuit substrate;
    patterning the conductive layer to simultaneously form a plate electrode in the cell region and a buffer pattern in the fuse region;
    forming a first insulation layer on the plate electrode and the buffer pattern;
    forming a metal layer on the first insulation layer that extends from the cell region to the fuse region;

patterning the metal layer to simultaneously form a metal wiring in the cell region of the integrated circuit substrate and a fuse pattern in the fuse region of the integrated circuit substrate;

forming a second insulation layer on the metal wiring and the fuse pattern;

forming a passivation layer on the second insulation layer; and etching the passivation layer and the second insulation layer in the fuse region of the integrated circuit substrate to form a window layer defining the fuse region.

2. The method of claim 1, wherein forming a conductive layer comprises forming a first conductive layer and wherein forming the buffer pattern comprises forming a first buffer pattern, the method further comprising:

forming a second conductive layer on the integrated circuit substrate extending from the cell region to the fuse region, the second conductive layer being positioned between the integrated circuit substrate and the first buffer pattern; and patterning the second conductive layer to simultaneously form a bit line in the cell region and a second buffer pattern in the fuse region.

3. The method of claim 2, wherein forming the second conductive layer further comprises:

forming a first layer of conductive material on the integrated circuit substrate;

forming a second layers of conductive material on the first layer of conductive material; and etching the first and second layer of conductive material to simultaneously form the bit line and the second buffer pattern.

4. The method of claim 3 wherein the first layer of conductive material comprises polysilicon and the second layer of conductive material comprises tungsten silicide.

5. The method of claim 2, further comprising forming a third insulation layer between the second buffer pattern and the first buffer pattern.

6. The method of claim 5 wherein forming the first buffer pattern comprises:

forming an fourth insulation layer on third insulation layer in the fuse region of the integrated circuit substrate; and etching the first conductive layer such that a portion of the first conductive layer remains on the fourth insulation layer in the fuse region of the integrated circuit substrate.

7. The method of claim 1, wherein forming the metal wiring and the fuse pattern comprises:

forming a first layer of a metal on the first insulation layer;

forming a second layer of a metal compound on the first layer;

forming a photoresist pattern on the first and second layers;

etching the first and second layers according to the photoresist pattern to simultaneously form the metal wiring and the fuse pattern.

8. The method of claim 2 wherein forming an integrated circuit device comprises forming an integrated circuit memory device.

9. The method of claim 8 wherein the integrated circuit memory device comprises a dynamic random access memory (DRAM) device.

* * * * *